(12) United States Patent
de Bock et al.

(10) Patent No.: US 10,584,923 B2
(45) Date of Patent: Mar. 10, 2020

(54) SYSTEMS AND METHODS FOR HEAT EXCHANGER TUBES HAVING INTERNAL FLOW FEATURES

(71) Applicant: General Electric Company, Schenectady, NY (US)

(72) Inventors: Hendrik Pieter Jacobus de Bock, Clifton Park, NY (US); Karthik Kumar Bodla, Watervliet, NY (US); William Dwight Gerstler, Niskayuna, NY (US); James Albert Tallman, Glenville, NY (US); Konrad Roman Weeber, Saratoga Springs, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/834,759

(22) Filed: Dec. 7, 2017

(65) Prior Publication Data

US 2019/0178585 A1   Jun. 13, 2019

(51) Int. Cl.
| | |
|---|---|
| *F28F 1/40* | (2006.01) |
| *F28D 7/16* | (2006.01) |
| *F28F 3/04* | (2006.01) |
| *F28F 9/02* | (2006.01) |
| *H01L 23/367* | (2006.01) |

(Continued)

(52) U.S. Cl.
CPC ............ *F28F 1/405* (2013.01); *F28D 7/1669* (2013.01); *F28F 3/04* (2013.01); *F28F 9/0263* (2013.01); *F28F 9/0282* (2013.01); *H01L 23/3672* (2013.01); *H01L 23/473* (2013.01); *B29C 35/007* (2013.01); *B29C 45/7312* (2013.01); *F05D 2260/213* (2013.01);

(Continued)

(58) Field of Classification Search
CPC ...... F28F 1/405; F28F 3/04; F28F 3/06; F28F 3/02; F28F 3/044; F28F 9/0282; F28D 7/1669; H01L 23/3672; H01L 23/4735; F22B 37/102; F22B 37/103; F22B 37/104; Y10T 29/49391; Y10T 29/4935; Y10T 29/49377; Y10T 29/49378; Y10T 29/49361; B29C 35/007; B29C 45/7312; B29C 45/14598
USPC .............................. 165/179, 104.33, 104.26
See application file for complete search history.

(56) References Cited

U.S. PATENT DOCUMENTS

| | | |
|---|---|---|
| 4,216,575 A | 8/1980 | Carnavos et al. |
| 4,402,359 A | 9/1983 | Carnavos et al. |

(Continued)

OTHER PUBLICATIONS

Tian et al., "Convective heat transfer and pressure drop of annular tubes with three different internal longitudinal fins", Heat Transfer—Asian Research, vol. 37, Issue: 1, pp. 29-40, Jan. 2008.

(Continued)

*Primary Examiner* — Joel M Attey
(74) *Attorney, Agent, or Firm* — Armstrong Teasdale LLP

(57) ABSTRACT

A support form defining a longitudinal axis is provided. The support form includes a first section, a second substantially solid section, and at least one flow feature form. The first section includes a plurality of unit cells of a first material joined together to form a lattice. The second section includes a second material and surrounds the first section. The at least one flow feature form is defined in the second section and is configured to generate a flow feature on a heat exchanger tube formed by plating the support form.

14 Claims, 10 Drawing Sheets

(51) Int. Cl.
*H01L 23/473* (2006.01)
*F22B 37/10* (2006.01)
*H01R 43/08* (2006.01)
*B29C 35/00* (2006.01)
*B29C 45/73* (2006.01)

(52) U.S. Cl.
CPC ......... *F22B 37/102* (2013.01); *H01L 23/4735* (2013.01); *H01R 43/08* (2013.01); *Y10T 29/49391* (2015.01)

(56) References Cited

U.S. PATENT DOCUMENTS

| | | |
|---|---|---|
| 5,070,937 A | 12/1991 | Mougin et al. |
| 6,302,194 B1 | 10/2001 | Kastner et al. |
| 7,178,586 B2 | 2/2007 | Goldman et al. |
| 7,490,658 B2 | 2/2009 | Sasaki et al. |
| 7,980,295 B2 * | 7/2011 | Takamatsu ............ F28D 15/043 165/104.26 |
| 2003/0043544 A1 * | 3/2003 | Nelson .................... A61K 31/00 361/690 |
| 2005/0126757 A1 * | 6/2005 | Bennett ................. F28D 15/046 165/104.11 |
| 2006/0243425 A1 * | 11/2006 | Dussinger ............ F28D 15/0233 165/104.26 |
| 2013/0220580 A1 * | 8/2013 | Kroliczek ........... F28D 15/0233 165/104.26 |
| 2015/0197858 A1 | 7/2015 | Corbeil et al. |
| 2015/0375715 A1 * | 12/2015 | Izabel .................. B60S 1/3415 239/284.1 |

OTHER PUBLICATIONS

Qiuwang et al., "Effect of Blocked Core-Tube Diameter on Heat Transfer Performance of Internally Longitudinal Finned Tubes", Heat Transfer Engineering, vol. 29, Issue: 1, pp. 107-115, 2008.

* cited by examiner

US 10,584,923 B2

SYSTEMS AND METHODS FOR HEAT EXCHANGER TUBES HAVING INTERNAL FLOW FEATURES

BACKGROUND

The subject matter described herein relates generally to heat exchanger tubes and, more particularly, to heat exchanger tubes including internal three-dimensional flow features.

Heat exchanger tubes carrying a fluid having a thermal energy content are ubiquitous in a variety of electrical and mechanical systems. For example, heat exchanger tubes may be used in heat exchangers, electrical machines, motors, and/or generators. At least some heat exchanger tubes include flow features to improve heat transfer and/or hydraulic performance. However, in at least some known systems, these flow features are generated using an extrusion process, and accordingly, are limited to two-dimensional flow features. These two-dimensional flow features may provide only limited improvements to heat transfer and/or hydraulic performance, especially at bends or turns in a heat exchanger tube. Other flow features with more complex geometries may be better suited to improving heat transfer and/or hydraulic performance, but may be relatively difficult to fabricate.

BRIEF DESCRIPTION

In one aspect, a support form defining a longitudinal axis is provided. The support form includes a first section, a second substantially solid section, and at least one flow feature form. The first section includes a plurality of unit cells of a first material joined together to form a lattice. The second section includes a second material and surrounds the first section. The at least one flow feature form is defined in the second section and is configured to generate a flow feature on a heat exchanger tube formed by plating the support form.

In another aspect, a method of fabricating a heat exchanger tube defining a longitudinal axis is provided. The method includes fabricating a support form, wherein the support form includes i) a first section including a plurality of unit cells of a first material joined together to form a lattice, ii) a second substantially solid section including a second material, the second section surrounding the first section, and iii) at least one flow feature form defined in the second section and configured to generate at least one flow feature. The method also includes depositing a third material on the support form to form the heat exchanger tube, wherein the heat exchanger tube includes i) an inlet, ii) an outlet, iii) a sidewall including an outer surface and an inner surface and extending between the inlet and the outlet along the longitudinal axis to define a passageway therebetween, and iv) the at least one flow feature extending from one of the sidewall inner surface and the sidewall outer surface. The method further includes removing the support form from the heat exchanger tube.

DRAWINGS

These and other features, aspects, and advantages of the present disclosure will become better understood when the following detailed description is read with reference to the accompanying drawings in which like characters represent like parts throughout the drawings, wherein.

Figure 1:
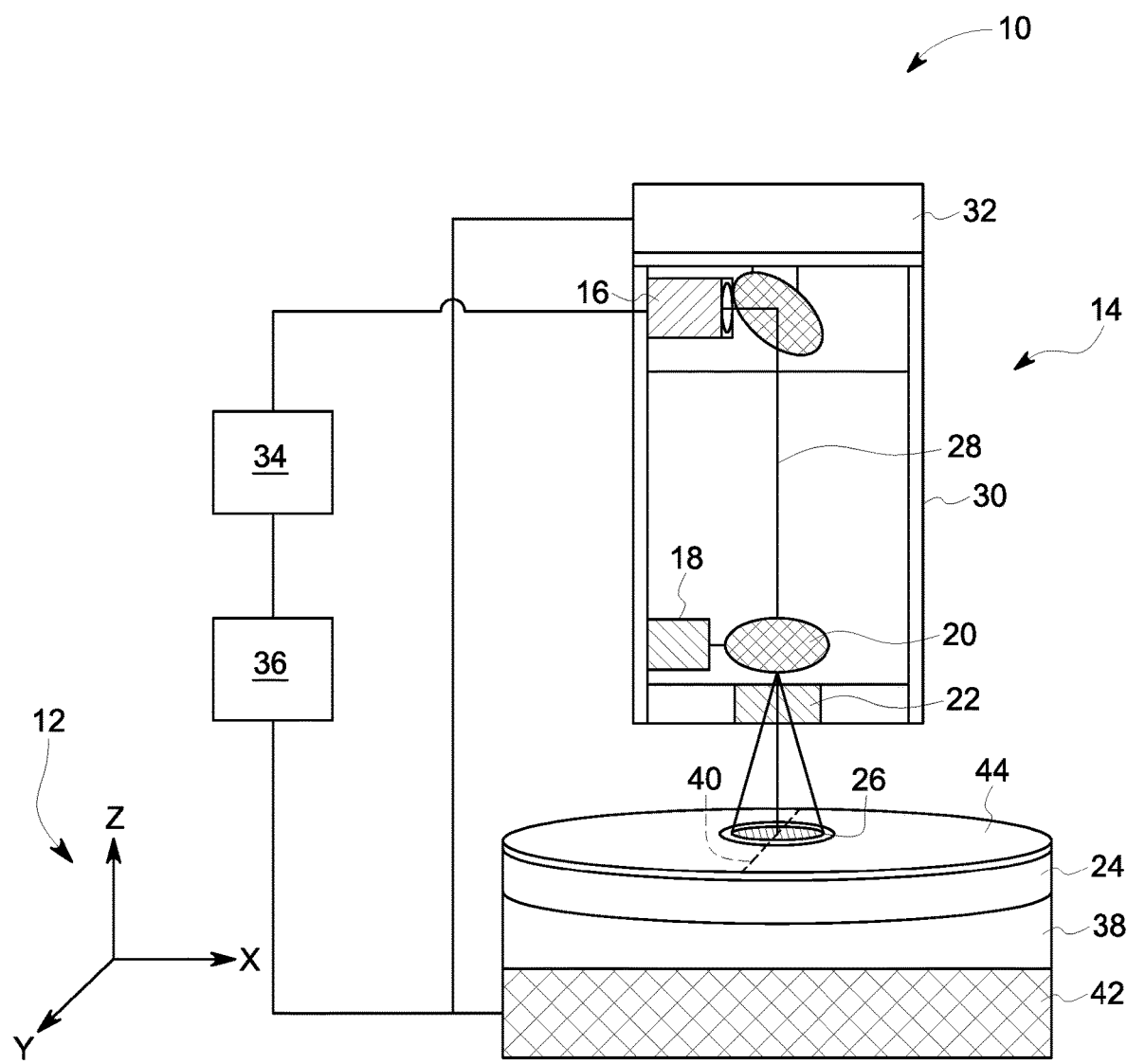
FIG. 1 is a schematic view of an exemplary additive manufacturing system.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, a programmable logic controller (PLC), and application specific integrated circuit, and other programmable circuits, and these terms are used interchangeably herein. In the embodiments described herein, memory may include, but it not limited to, a computer-readable medium, such as a random access memory (RAM), a computer-readable non-volatile medium, such as a flash memory. Alternatively, a floppy disk, a compact disc—read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, and servers.

As used herein, the term "non-transitory computer-readable media" is intended to be representative of any tangible computer-based device implemented in any method of technology for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including without limitation, volatile and non-volatile media, and removable and non-removable media such as firmware, physical and virtual storage, CD-ROMS, DVDs, and any other digital source such as a network or the Internet, as well as yet to be developed digital means, with the sole exception being transitory, propagating signal.

Furthermore, as used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

The systems and methods described herein include a support form having a multi-structure cross-section and at least one internal flow feature form, and a heat exchanger tube having at least one internal flow feature extending from an inner sidewall. The multi-structure cross-section of the support form includes a first section including a plurality of unit cells joined together and a second substantially solid section surrounding the first section. The internal flow feature is a three-dimensional flow feature having a varying cross-section along a longitudinal axis of the heat exchanger tube that is a corresponding inverse model of the three-dimensional internal flow feature form of the support form. The geometry of the flow feature facilitates improving heat transfer capabilities and/or hydraulic capabilities of the heat exchanger tube relative to two-dimensional flow features fabricated using existing methods.

Additive manufacturing processes and systems include, for example, and without limitation, vat photopolymerization, powder bed fusion, binder jetting, material jetting, sheet lamination, material extrusion, directed energy deposition and hybrid systems. These processes and systems include, for example, and without limitation, SLA—Stereolithography Apparatus, DLP—Digital Light Processing, 3SP—Scan, Spin, and Selectively Photocure, CLIP—Continuous Liquid Interface Production, SLS—Selective Laser Sintering, DMLS—Direct Metal Laser Sintering, SLM—Selective Laser Melting, EBM—Electron Beam Melting, SHS—Selective Heat Sintering, MJF—Multi-Jet Fusion, 3D Printing, Voxeljet, Polyjet, SCP—Smooth Curvatures Printing, MJM—Multi-Jet Modeling Projet, LOM—Laminated Object Manufacture, SDL—Selective Deposition Lamination, UAM—Ultrasonic Additive Manufacturing, FFF—Fused Filament Fabrication, FDM—Fused Deposition Modeling, LMD—Laser Metal Deposition, LENS—Laser Engineered Net Shaping, DMD—Direct Metal Deposition, Hybrid Systems, and combinations of these processes and systems. These processes and systems may employ, for example, and without limitation, all forms of electromagnetic radiation, heating, sintering, melting, curing, binding, consolidating, pressing, embedding, and combinations thereof.

Additive manufacturing processes and systems employ materials including, for example, and without limitation, polymers, plastics, metals, ceramics, sand, glass, waxes, fibers, biological matter, composites, and hybrids of these materials. These materials may be used in these processes and systems in a variety of forms as appropriate for a given material and the process or system, including, for example, and without limitation, as liquids, solids, powders, sheets, foils, tapes, filaments, pellets, liquids, slurries, wires, atomized, pastes, and combinations of these forms.

FIG. 1 is a schematic view of an exemplary additive manufacturing system 10. A coordinate system 12 includes an x-axis, a y-axis, and a z-axis. In the exemplary embodiment, additive manufacturing system 10 includes a consolidating device 14 including a laser device 16, a scanning motor 18, a scanning mirror 20, and a scanning lens 22 for fabricating a component 24 using a layer-by-layer manufacturing process. Alternatively, consolidating device 14 may include any component that facilitates consolidation of a material using any of the processes and systems described herein. Laser device 16 provides a high-intensity heat source configured to generate a melt pool 26 (not shown to scale) in a powdered material using an energy beam 28. Laser device 16 is contained within a housing 30 that is coupled to a mounting system 32. Additive manufacturing system 10 also includes a computer control system, or controller 34. Mounting system 32 is moved by an actuator or an actuator system 36 that is configured to move mounting system 32 in an XY plane to cooperate with scanning mirror 20 to facilitate fabricating a layer of component 24 within additive manufacturing system 10. For example, and without limitation, mounting system 32 is pivoted about a central point, moved in a linear path, a curved path, and/or rotated to cover a portion of the powder on a powder bed 38 to facilitate directing energy beam 28 along the surface of component 24. Alternatively, housing 30 and energy beam 28 are moved in any orientation and manner that enables additive manufacturing system 10 to function as described herein.

Scanning motor 18 is controlled by controller 34 and is configured to move mirror 20 such that energy beam 28 is reflected to be incident along a predetermined path along powder bed 38, such as, for example, and without limitation, a linear and/or rotational scan path 40. In the exemplary embodiment, the combination of scanning motor 18 and scanning mirror 20 forms a two-dimension scan galvanometer. Alternatively, scanning motor 18 and scanning mirror 20 may include a three-dimension (3D) scan galvanometer, dynamic focusing galvanometer, and/or any other method that may be used to deflect energy beam 28 of laser device 16.

In the exemplary embodiment, powder bed 38 is mounted to a support structure 42, which is moved by actuator system 36. As described above with respect to mounting system 32, actuator system 36 is also configured to move support structure 42 in a Z direction (i.e., normal to a top surface of powder bed 38). In some embodiments, actuator system 36 is also configured to move support structure 42 in the XY plane. For example, and without limitation, in an alternative embodiment where housing 30 is stationary, actuator system 36 moves support structure 42 in the XY plane to cooperate with scanning motor 18 and scanning mirror 20 to direct energy beam 28 of laser device 16 along scan path 40 about powder bed 38. In the exemplary embodiment, actuator system 36 includes, for example, and without limitation, a linear motor(s), a hydraulic and/or pneumatic piston(s), a screw drive mechanism(s), and/or a conveyor system.

In the exemplary embodiment, additive manufacturing system 10 is operated to fabricate component 24 from a computer modeled representation of the 3D geometry of component 24. The computer modeled representation may be produced in a computer aided design (CAD) or similar file. The CAD file of component 24 is converted into a layer-by-layer format that includes a plurality of build parameters for each layer of component 24, for example, build layer 44 of component 24. In the exemplary embodiment, component 24 is modeled in a desired orientation relative to the origin of the coordinate system used in additive manufacturing system 10. The geometry of component 24 is sliced into a stack of layers of a desired thickness, such that the geometry of each layer is an outline of the cross-section through component 24 at that particular layer location. Scan paths 40 are generated across the geometry of a respective layer. The build parameters are applied along scan path 40 to fabricate that layer of component 24 from the material used to construct component 24. The steps are repeated for each respective layer of component 24 geometry. Once the process is completed, an electronic computer build file (or files) is generated, including all of the layers. The build file is loaded into controller 34 of additive manufacturing system 10 to control the system during fabrication of each layer.

After the build file is loaded into controller 34, additive manufacturing system 10 is operated to generate component 24 by implementing the layer-by-layer manufacturing process, such as a direct metal laser melting method. The exemplary layer-by-layer additive manufacturing process does not use a pre-existing article as the precursor to the final component, rather the process produces component 24 from a raw material in a configurable form, such as a powder. For example, and without limitation, a steel component can be additively manufactured using a steel powder. Additive manufacturing system 10 enables fabrication of components, such as component 24, using a broad range of materials, for example, and without limitation, metals, ceramics, glass, and polymers.

Figure 2:
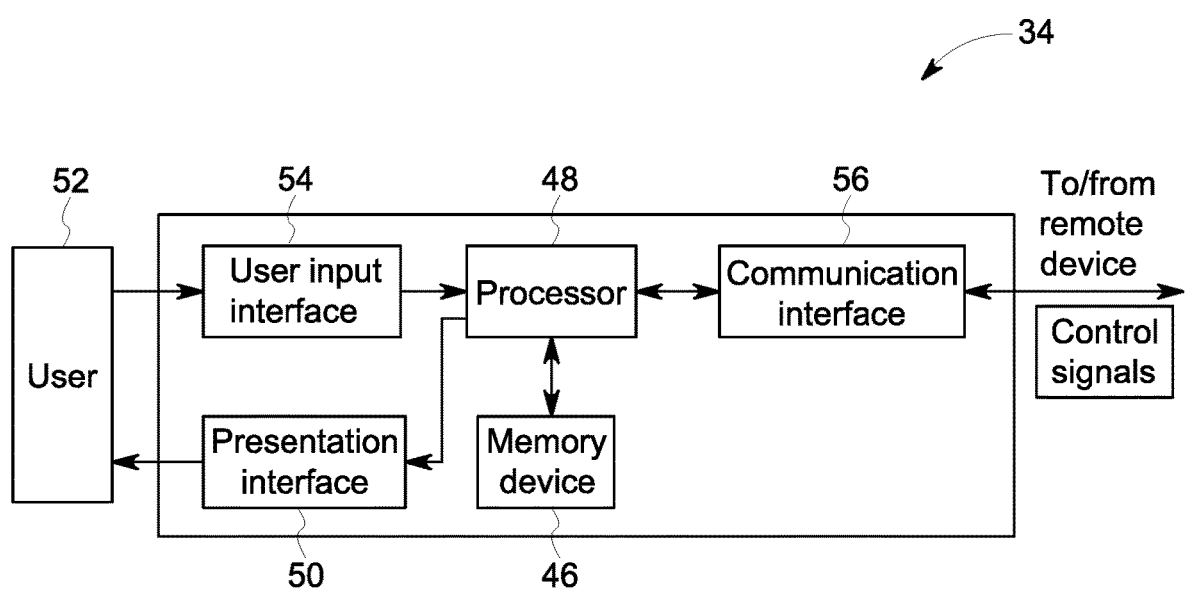
FIG. 2 is a block diagram of a controller that is used to operate the additive manufacturing system shown in FIG. 1.

FIG. 2 is a block diagram of controller 34 that is used to operate additive manufacturing system 10 (shown in FIG. 1). In the exemplary embodiment, controller 34 is any type of controller typically provided by a manufacturer of additive manufacturing system 10 to control operation of additive manufacturing system 10. Controller 34 executes operations to control the operation of additive manufacturing system 10 based at least partially on instructions from human operators. Controller 34 includes, for example, a 3D model of component 24 to be fabricated by additive manufacturing system 10. Operations executed by controller 34 include controlling power output of laser device 16 (shown in FIG. 1) and adjusting mounting system 32 and/or support structure 42, via actuator system 36 (all shown in FIG. 1) to control the scanning velocity of energy beam 28. Controller 34 is also configured to control scanning motor 18 to direct scanning mirror 20 to further control the scanning velocity of energy beam 28 within additive manufacturing system 10. In alternative embodiments, controller 34 may execute any operation that enables additive manufacturing system 10 to function as described herein.

In the exemplary embodiment, controller 34 includes a memory device 46 and a processor 48 coupled to memory device 46. Processor 48 may include one or more processing units, such as, without limitation, a multi-core configuration. Processor 48 is any type of processor that permits controller 34 to operate as described herein. In some embodiments, executable instructions are stored in memory device 46. Controller 34 is configurable to perform one or more operations described herein by programming processor 48. For example, processor 48 may be programmed by encoding an operation as one or more executable instructions and providing the executable instructions in memory device 46. In the exemplary embodiment, memory device 46 is one or more devices that enable storage and retrieval of information such as executable instructions or other data. Memory device 46 may include one or more computer readable media, such as, without limitation, random access memory (RAM), dynamic RAM, static RAM, a solid-state disk, a hard disk, read-only memory (ROM), erasable programmable ROM, electrically erasable programmable ROM, or non-volatile RAM memory. The above memory types are exemplary only, and are thus not limiting as to the types of memory usable for storage of a computer program.

Memory device 46 may be configured to store any type of data, including, without limitation, build parameters associated with component 24. In some embodiments, processor 48 removes or "purges" data from memory device 46 based on the age of the data. For example, processor 48 may overwrite previously recorded and stored data associated with a subsequent time or event. In addition, or alternatively, processor 48 may remove data that exceeds a predetermined time interval. In addition, memory device 46 includes, without limitation, sufficient data, algorithms, and commands to facilitate monitoring of build parameters and the geometric conditions of component 24 being fabricated by additive manufacturing system 10.

In some embodiments, controller 34 includes a presentation interface 50 coupled to processor 48. Presentation interface 50 presents information, such as the operating conditions of additive manufacturing system 10, to a user 52. In one embodiment, presentation interface 50 includes a display adapter (not shown) coupled to a display device (not shown), such as a cathode ray tube (CRT), a liquid crystal display (LCD), an organic LED (OLED) display, or an "electronic ink" display. In some embodiments, presentation interface 50 includes one or more display devices. In addition, or alternatively, presentation interface 50 includes an audio output device (not shown), for example, without limitation, an audio adapter or a speaker (not shown).

In some embodiments, controller 34 includes a user input interface 54. In the exemplary embodiment, user input interface 54 is coupled to processor 48 and receives input from user 52. User input interface 54 may include, for example, without limitation, a keyboard, a pointing device, a mouse, a stylus, a touch sensitive panel, such as, without limitation, a touch pad or a touch screen, and/or an audio input interface, such as, without limitation, a microphone. A single component, such as a touch screen, may function as both a display device of presentation interface 50 and user input interface 54.

In the exemplary embodiment, a communication interface 56 is coupled to processor 48 and is configured to be coupled in communication with one or more other devices, such as laser device 16, and to perform input and output operations with respect to such devices while performing as an input channel. For example, communication interface 56 may include, without limitation, a wired network adapter, a wireless network adapter, a mobile telecommunications adapter, a serial communication adapter, or a parallel communication adapter. Communication interface 56 may receive a data signal from or transmit a data signal to one or more remote devices. For example, in some embodiments, communication interface 56 of controller 34 may transmit/receive a data signal to/from actuator system 36.

Presentation interface 50 and communication interface 56 are both capable of providing information suitable for use with the methods described herein, such as, providing information to user 52 or processor 48. Accordingly, presentation interface 50 and communication interface 56 may be referred to as output devices. Similarly, user input interface 54 and communication interface 56 are capable of receiving information suitable for use with the methods described herein and may be referred to as input devices.

Figure 3A:
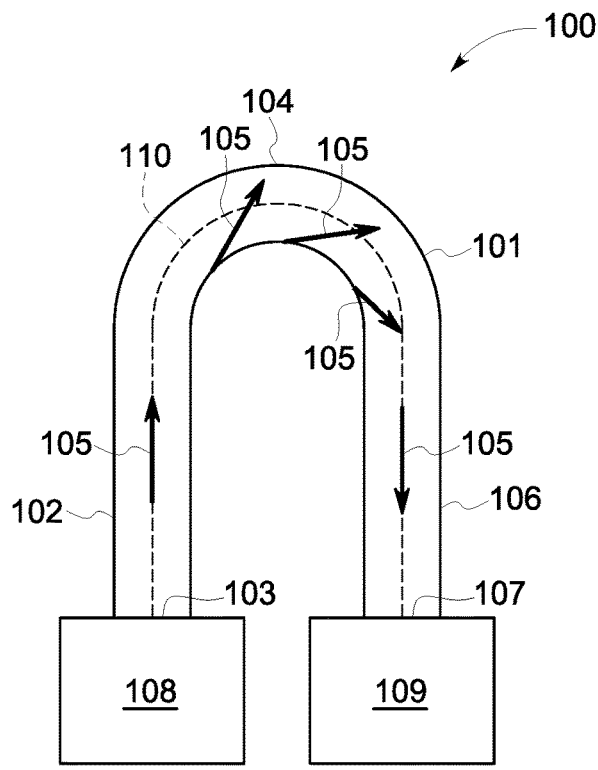
FIGS. 3A and 3B are schematic diagrams of exemplary heat exchanger systems.

FIG. 3A is a schematic diagram of an exemplary heat exchanger system 100 including a heat exchanger tube 101. Heat exchanger tube 101 includes, in series, a first linear segment 102, an arcuate segment 104, and a second linear segment 106. The shape and arrangement of heat exchanger tube 101 is merely an example, and those of skill in the art will appreciate that heat exchanger tube 101 may have any configuration that enables heat exchanger tube 101 to function as described herein.

In the exemplary embodiment, a fluid having a thermal energy content flows through heat exchanger tube 101 to facilitate cooling one or more components in a system including heat exchanger tube 101. In the exemplary embodiment, the fluid is a cooling fluid. In an alternative embodiment, the fluid is a fluid used for heating. For example, heat exchanger tube 101 may be installed in a heat exchanger, electrical machine, motor generator, and/or hydraulic system. In the exemplary embodiment cooling fluid flows into first linear segment 102 at an inlet 103, through first linear segment 102 into arcuate segment 104, from arcuate segment 104 into second linear segment 106, and out of second linear segment 106 at an outlet 107. The cooling fluid may be any suitable gas or liquid. A cooling fluid source 108 is in fluid communication with inlet 103 to provide cooling fluid to heat exchanger tube 101. Similarly, a cooling fluid reservoir 109 is in fluid communication with outlet 107 to receive cooling fluid from heat exchanger tube 101.

In the embodiment shown in FIG. 3A, heat exchanger tube 101 does not include any internal flow features (e.g., fins, posts, pins, etc.) to facilitate guiding the flow of cooling fluid through heat exchanger tube 101. Accordingly, as demonstrated by a number of flow lines 105 indicating the direction of fluid flow, the shape of heat exchanger tube 101 causes flow separation. For example, cooling fluid initially flows along a longitudinal axis 110 of heat exchanger tube 101 (i.e., in first linear segment 102). However, when cooling fluid encounters arcuate segment 104, the cooling fluid no longer flows parallel to longitudinal axis 110. This flow separation reduces a flow rate of cooling fluid and causes pressure drops, which are undesirable.

Figure 3B:
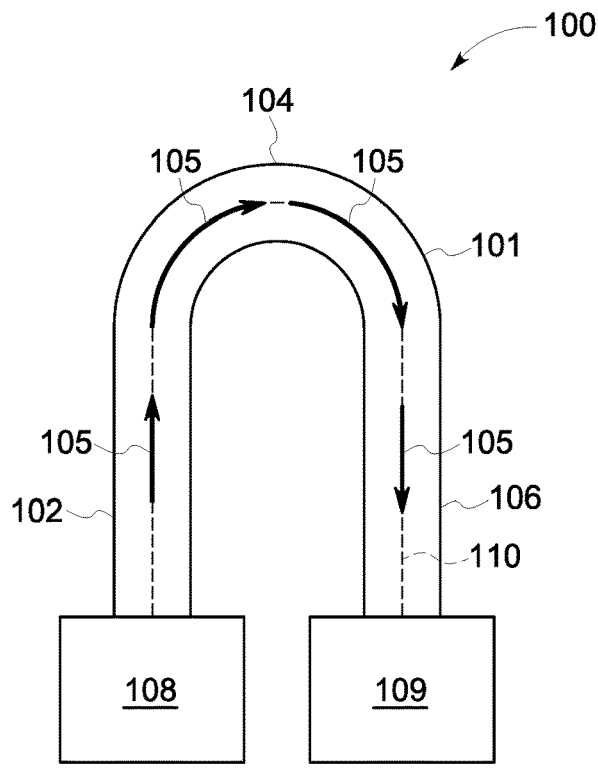

In contrast, FIG. 3B illustrates flow though heat exchanger tube 101 when heat exchanger tube 101 includes a plurality of internal flow features (not shown in FIG. 3B). As shown by flow lines 105 in FIG. 3B, the internal flow features substantially prevent flow separation, reducing losses and pressure drops. This further facilitates increasing a heat transfer coefficient for heat exchanger tube 101.

Accordingly, it is desirable to including internal flow features in heat exchanger tubes. However, fabricating internal flow features having relatively complex geometries is inhibited using at least some known systems. Instead, known systems are generally limited to using an extrusion process to generate two-dimensional flow features (i.e., flow features that have the same cross-section in planes orthogonal to longitudinal axis 110 at different locations along longitudinal axis 110). In contrast, the systems and methods described herein use exemplary support forms to facilitate generating three-dimensional internal flow features (i.e., flow features that have a varying cross-section in planes orthogonal to longitudinal axis 110 at different locations along longitudinal axis 110).

The systems and methods described herein use multiple support forms (i.e., negative molds of the desired heat exchanger tubes) that are coupled together before undergoing a plating process. The plating process creates a continuous positive cast, the heat exchanger tube, surrounding exposed surfaces of the support forms and incorporating any complex shapes and features present in the original negative mold support forms. After the plating process is complete, the support forms are removed from within the newly formed heat exchanger tube. The support forms include an internal lattice section that facilitates removal of the support form from within the heat exchanger tube without deformation of the heat exchanger tube by inhibiting the build-up of pressure and retention of melted material due to the porous nature of the lattice structure, for example. Additionally, the support forms described herein include structural features that may be fabricated using an additive manufacturing process to facilitate the effective and efficient removal of the support forms from within the heat exchanger tube following the plating process.

Figure 4:
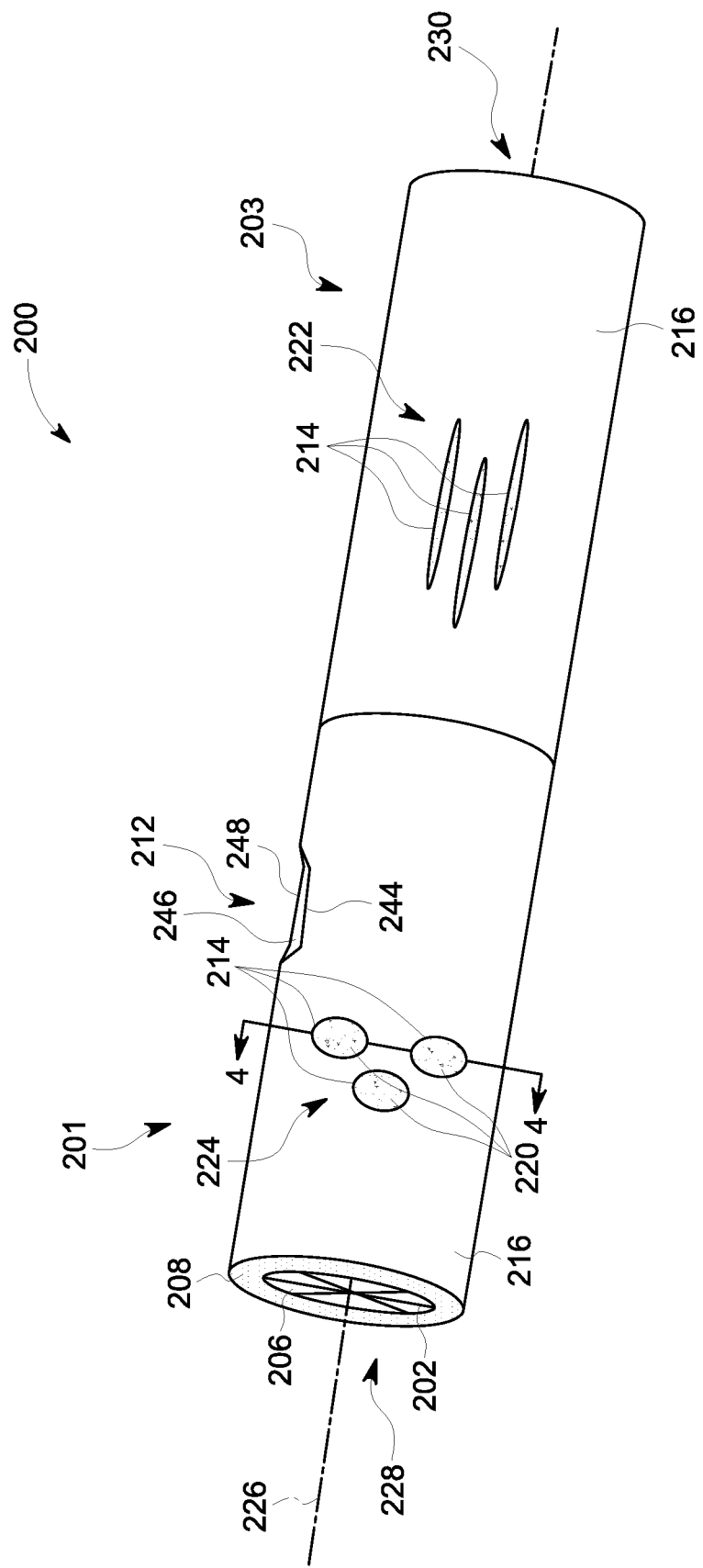
FIG. 4 is a perspective of view of exemplary support form segments.
Figure 5:
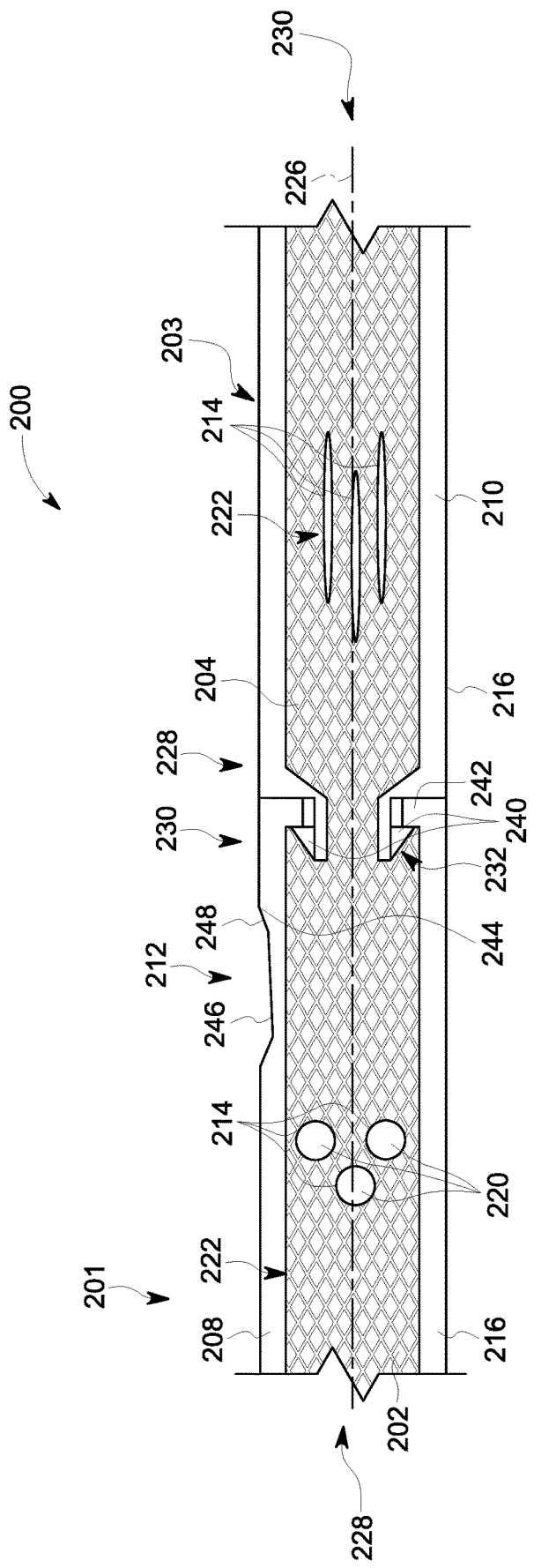
FIG. 5 is a section side view of the support form segments shown in FIG. 4.
Figure 6:
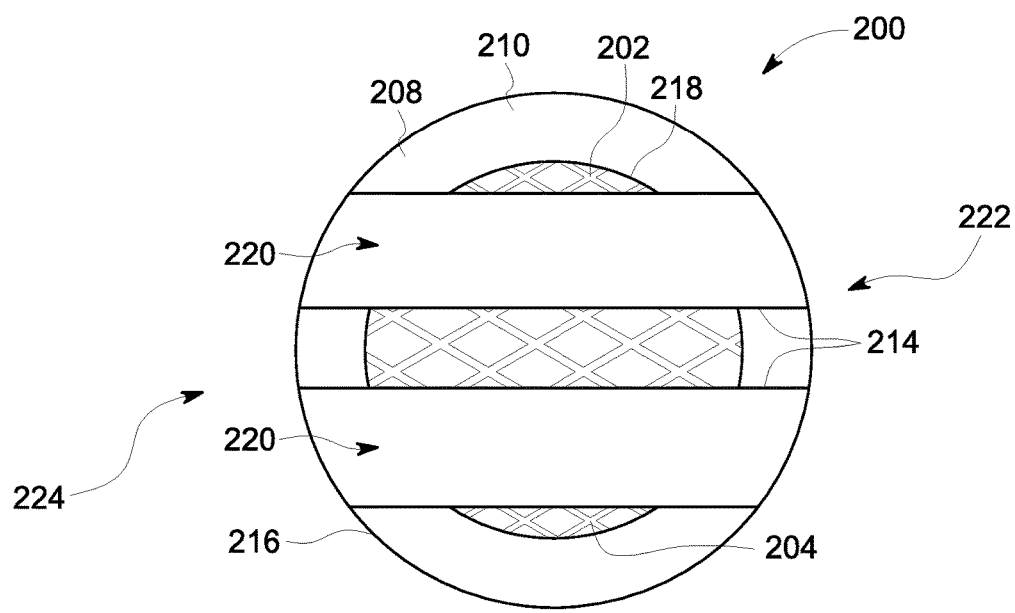
FIG. 6 is a section view of one of the support form segments shown in FIG. 4 taken about section line 4-4.

FIG. 4 is a perspective of view of exemplary support forms 200 that may be used to facilitate fabricating a heat exchanger tube, such as heat exchanger tube 101, for use with heat exchanger system 100 (shown in FIGS. 3A and 3B). FIG. 5 is a section side view of support forms 200 (shown in FIG. 4). FIG. 6 is a section view of support form 200 (shown in FIG. 4) taken about section line 4-4. In the exemplary embodiment, each support form 200 has a substantially circular cross-section and defines a longitudinal axis 226. Each support form 200 includes a first section 202, a second section 208, and at least one internal flow feature form 212. In an alternative embodiment, support form 200 may have any cross-sectional shape including, but not limited to, triangular, elliptical, and rectangular. In other alternative embodiments, support form 200 may include any number and type of sections and flow features as enable support form 200 to function as described herein.

In the exemplary embodiment, first section 202 includes a first material 204 and a plurality of unit cells 206 joined together to form a lattice structure. Second section 208 includes a substantially solid second material 210 and surrounds first section 202. In the exemplary embodiment, first section 202 is coupled to second section 208. In an alternative embodiment, first section 202 is formed integrally with second section 208. In the exemplary embodiment, at least one internal flow feature form 212 is defined in an outer wall 216 of second section 208. Internal flow feature form 212 is a three dimensional volume having a varying cross-section along longitudinal axis 226 of support form 200. Internal flow feature form 212 is a negative mold that will yield a positive cast of the geometry of internal flow feature form 212 when plated over or otherwise covered with a material.

In the exemplary embodiment, support forms 200 include a first support form 201 and a second support form 203. First support form 201 is coupled to second support form 203. First support form 201 and second support form 203 define a plurality of transverse flow feature forms 214. Each transverse flow feature form 214, as shown best in FIG. 6, is a volume extending from a first portion 222 of outer wall 216 through second section 208 and first section 202 to an intersection with a second portion 224 of outer wall 216 and defines a through-passageway 220 therebetween. Transverse flow feature forms 214 of first support form 201 are heat exchanger passageway forms. Transverse flow feature forms 214 of second support form 203 are flow straightener forms. Additionally, each transverse flow feature form 214 provides additional structural support to a respective support form 200 during the removal of support forms 200 from heat exchanger tube 101. In an alternative embodiment, transverse flow feature forms 214 may be substantially solid and may be configured to support heat exchanger tube 101 to facilitate maintaining the shape of heat exchanger tube 101 during removal of support form 200, such as when the removal of support form 200 from heat exchanger tube 101 includes a furnace cycle to solidify the crystalline structure of heat exchanger tube 101. In alternative embodiments, first and second support forms 201 and 203 may include any type and quantity of transverse flow feature forms 214 as facilitates operation of support form 200 as described herein.

In the exemplary embodiment, with reference to FIG. 5, first support form 201 is coupled to second support form 203. First end 228 of second support form 203 includes a first, male connector 232 extending along longitudinal axis 226. Second end 230 of first support form 201 includes a second, female connector 234 configured to receive first connector 232 of second support form 203. In the exemplary embodiment, a plurality of barbs 240 extend from first connector 232 and are configured to be received against a retention extension 242 of second connector 234 to facilitate retaining first connector 232 within second connector 234. Alternatively, first support form 201 may be coupled to second support form 203 in any manner that facilitates operation of first support form 201 and second support form 203 as described herein.

In the exemplary embodiment, first material 204 of first section 202 and second material 210 of second section 208 are the same material. In alternative embodiments, first material 204 and second material 210 are different materials. In the exemplary embodiment, first section 202 and second section 208 are integrally formed. In alternative embodiments, first section 202 and second section 208 are other than integrally formed. In yet other alternative embodiments, first section 202 and second section 208 are formed of any material in any manner that facilitates operation of support form 200 as described herein.

Figure 7:
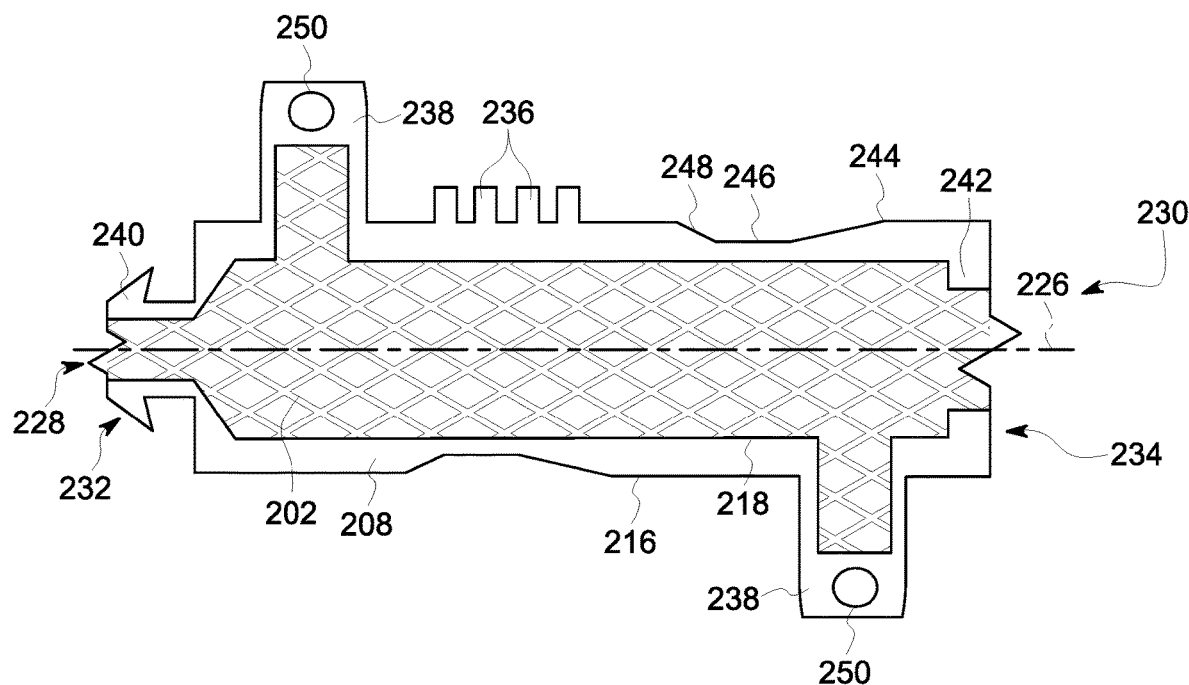
FIG. 7 is a section side view of an alternative embodiment of the support form segments shown in in FIG. 4.

FIG. 7 is a section side view of an alternative embodiment of support form 200 (shown in in FIG. 4) illustrating a plurality of heat exchanger fin forms 236 and a pair of mounting feature forms 238. The embodiment shown in FIG. 7 is substantially identical to the embodiment shown in FIGS. 4-6, except support form 200 includes heat exchanger fin forms 236 and mounting feature forms 238. In the exemplary embodiment, plurality of heat exchanger fin forms 236 extend outward from outer wall 216. Each mounting feature form 238 extends outward from outer wall 216 and includes a fastener pass-through 250. When support form 200 is exposed to a plating process, a material that is plated on the outer surface of support form 200 covers the outer surface of each of heat exchanger fin forms 236 and mounting feature forms 238, forming a positive cast of the negative molds. Completion of the plating process on this alternative embodiment of support form 200 will yield positive casts of heat exchanger fins and through-holes corresponding to heat exchanger fin forms 236 and mounting feature forms 238, respectively, as part of the resulting heat exchanger tube. In alternative embodiments, support form 200 may include any type and number of mounting feature forms, heat exchanger fin forms, and flow manipulation forms as facilitates operation of support form 200 as described herein.

Figure 8:
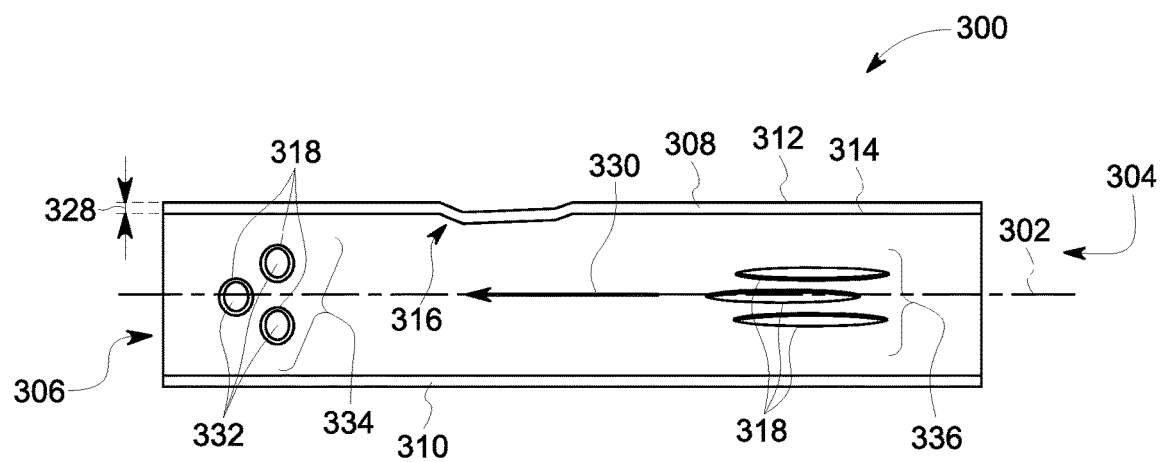
FIG. 8 is a section view of a heat exchanger tube segment that may be fabricated using the support forms shown in FIGS. 4-6.

FIG. 8 is a section view of a heat exchanger tube segment 300 that may be fabricated using support forms 200 (shown in FIGS. 4-6). In the exemplary embodiment, heat exchanger tube segment 300 may form all or part of a heat exchanger tube, such as heat exchanger tube 101. Heat exchanger tube segment 300 includes a sidewall 308 extending between an inlet 304 and an outlet 306 along a longitudinal axis 302 to define a primary passageway 330 therebetween, and at least one internal flow feature 316 extending inward from sidewall 308. In the exemplary embodiment, heat exchanger tube segment 300 is annular (i.e., having a circular cross-section) and is formed by using a plating process to plate exposed surfaces of support forms 200 as described herein. Alternatively, heat exchanger tube segment 300 may have any shape and may be formed using any process that enables heat exchanger tube segment 300 to function as described herein. For example, heat exchanger tube segment 300 may have an elliptical or rectangular cross-section in some embodiments.

In the exemplary embodiment, sidewall 308 includes a third material 310 and has a thickness 328. Sidewall 308 includes an outer surface 312 and an inner surface 314. In the exemplary embodiment, third material 310 is a copper alloy. In an alternative embodiment, third material 310 is an aluminum alloy. In additional alternative embodiments, third material 310 is any type of material that facilitates operation of heat exchanger tube segment 300 as described herein.

In the exemplary embodiment, the at least one internal flow feature 316 extends inward from inner surface 314 into primary passageway 330. Each internal flow feature 316 includes a three-dimensional flow feature having a varying cross-section along longitudinal axis 302 of heat exchanger tube segment 300. Accordingly, internal flow features 316 affect and impact the flow of cooling fluid through heat exchanger tube segment 300. As used herein, a cross-section for an internal flow feature refers to a cross-section taken in a plane perpendicular to longitudinal axis 302. For example, a first cross-section of internal flow feature 316 may be taken in a first plane orthogonal to longitudinal axis 302, and a second cross-section of internal flow feature may be taken in a second plane orthogonal to longitudinal axis 302, wherein the first plane is positioned closer to outlet 306 along longitudinal axis 302 than the second plane.

For a two-dimensional flow feature, a cross-section of the two-dimensional flow feature will be the same regardless of the relative position of the cross-section along a longitudinal axis of the two-dimensional flow feature. In some known systems, the two-dimensional flow feature is rotated (e.g., creating a spiraling two-dimensional flow feature). However, for a two-dimensional flow feature, even with the rotation, a first cross-section at a first plane is identical to a second cross-section at a second plane (with the second cross-section being a rotated version of the first cross-section). In contrast, the systems and methods described herein facilitate forming three-dimensional internal flow features 316. Three-dimensional internal flow features 316 have varying cross-sections along longitudinal axis 302. That is, for each three-dimensional internal flow feature 316, a first cross-section at a first plane would be different from a second cross-section at a second plane.

In the exemplary embodiment, a plurality of transverse flow features 318 extend across primary passageway 330 between two different locations on inner surface 314. In the exemplary embodiment, a first group 334 of transverse flow features 318 are heat exchanger passageways configured to facilitate directing a flow of fluid through secondary passageways 332 across primary passageway 330. A second group 336 of transverse flow features 318 are flow straighteners configured to facilitate manipulation of fluid traveling within heat exchanger tube segment 300 along primary passageway 330 and to provide additional structural support to heat exchanger tube segment 300. In alternative embodiments, heat exchanger tube segment 300 may include features that extend outward from outer surface 312, including, for example, heat exchanger fins formed using heat exchanger fin forms 236 and configured to facilitate heat exchange and mounting extensions configured to facilitate securing heat exchanger tube segment 300. In further alternative embodiments, heat exchanger tube segment 300 may include any number and type of flow features and extensions that facilitate operation of heat exchanger tube segment 300 as described herein.

Figure 9:
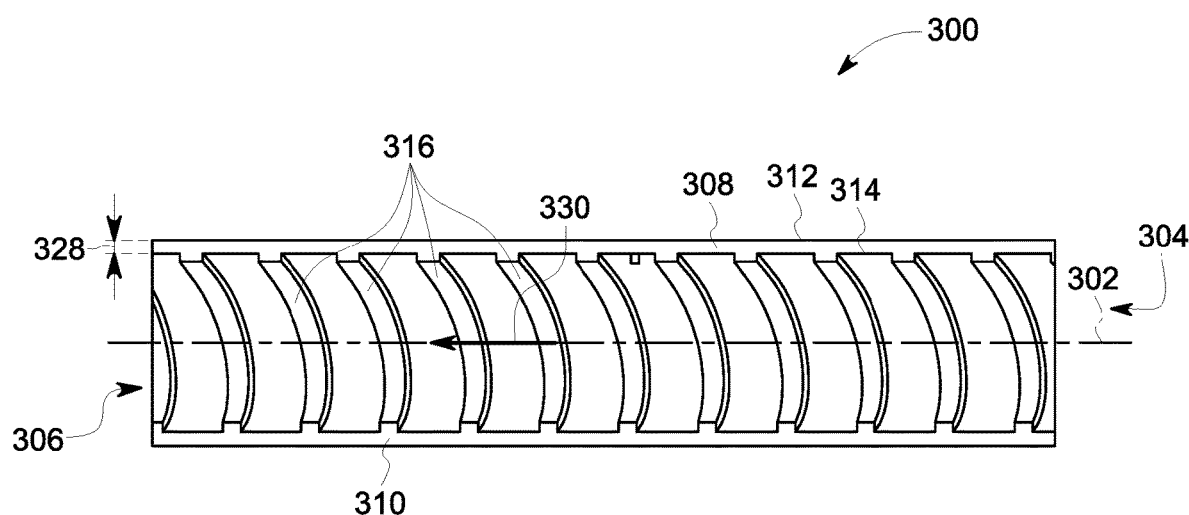
FIG. 9 is a sectional perspective view of an alternative embodiment of the heat exchanger tube segment shown in FIG. 8.

FIG. 9 is a sectional side perspective view of an alternative embodiment of heat exchanger tube segment 300 (shown in FIG. 8) illustrating a spiral-shaped internal flow feature 316. The embodiment shown in FIG. 9 is substantially identical to the embodiment shown in FIG. 8, except heat exchanger tube segment 300 includes a single continuous three-dimensional internal flow feature 316 that extends inward from inner surface 314 into primary passageway 330 and along the length of heat exchanger tube segment 300 in the shape of a spiral relative to longitudinal axis 302. In the exemplary embodiment, spiral-shaped internal flow feature 316 facilitates continuous mixing of a fluid traveling through heat exchanger tube segment 300 to facilitate improving heat transfer between the fluid and the heat exchanger tube segment 300. In an alternative embodiment, spiral-shaped internal flow feature 316 may have a varying cross-sectional area along the length of heat exchanger tube 300. In additional alternative embodiments, heat exchanger tube segment 300 may include any number and type of internal flow features 316 that facilitates operation of heat exchanger tube segment 300 as described herein.

Figure 10A:
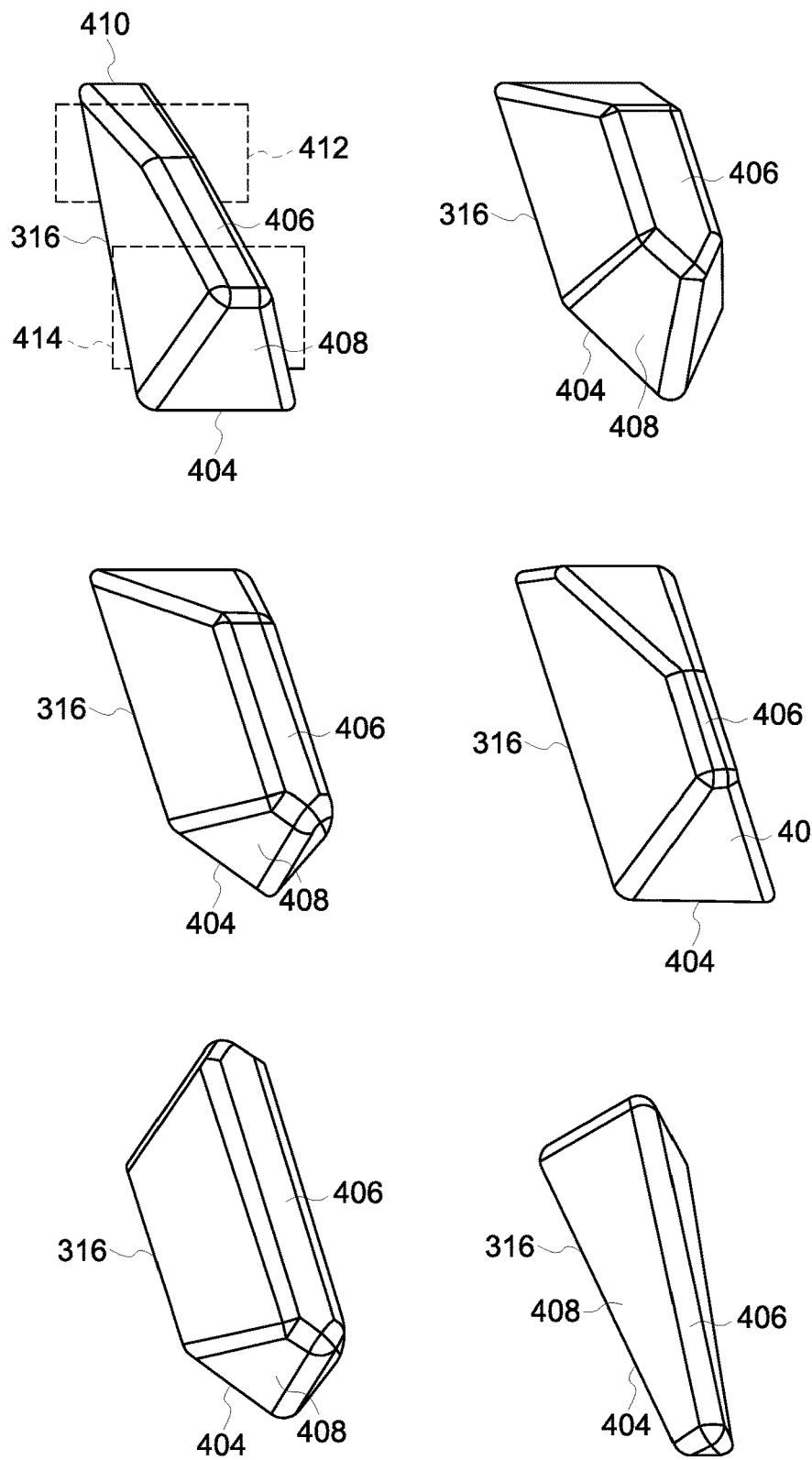
FIGS. 10A and 10B are perspective views of a plurality of three-dimensional flow features that may be used with the heat exchanger tube segment shown in FIG. 5.
Figure 10B:
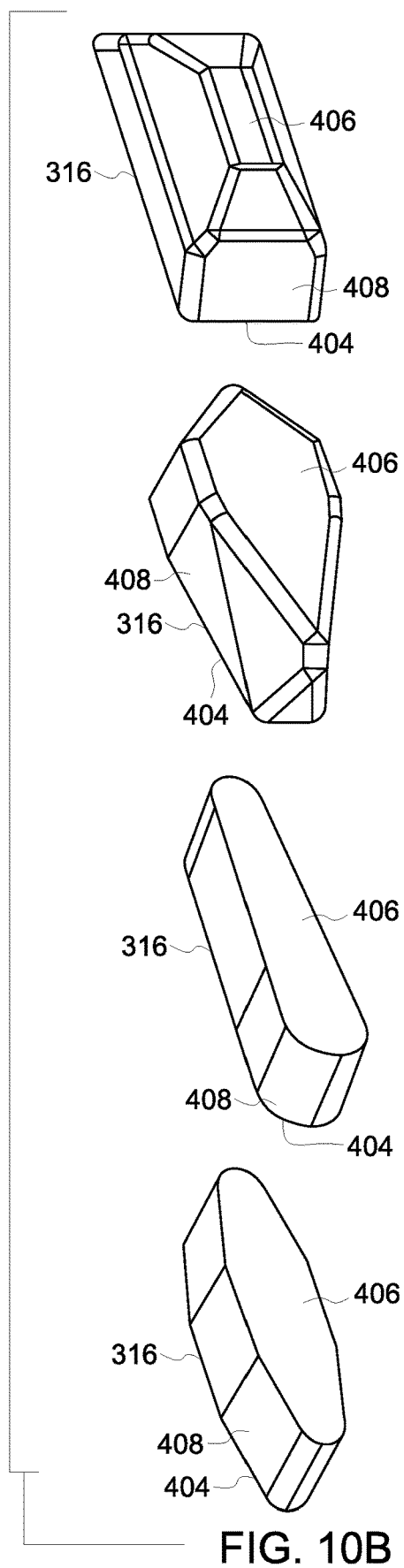

FIGS. 10A and 10B shows perspective views of a plurality of three-dimensional internal flow features 316 that may be generated using the systems and methods described herein. Those of skill in the art will appreciate that internal flow features 316 are merely examples, and the disclosure is not limited to the three-dimensional internal flow features 316 shown in FIGS. 10A and 10B. For example, internal flow features fabricated using the systems and methods described herein may include pin fins, staggered swirling fins, louvered fins, concentric tubes, guide vanes, turning vanes, and/or turbulators. In some embodiments, the internal flow feature may be fabricated in a herringbone pattern or any other suitable pattern. Further, the internal flow features may be shaped and oriented to facilitate improving heat transfer and/or hydraulic performance of the heat exchanger tube in which they are located, facilitating increased power density in systems including the heat exchanger tube. As shown in FIGS. 10A and 10B, internal flow features 316 may have relatively complex geometries.

In the exemplary embodiment, each internal flow feature 316 includes a base 404, an apex 406, and at least one wall 408 extending from base 404 towards apex 406. When a given internal flow feature 316 is included in heat exchanger tube segment 300, base 404 generally contacts (and may be integrally formed with or coupled to) inner surface 314, and internal flow feature 316 extends generally radially inwardly from base 404 to apex 406. That is, apex 406 is generally located closer to longitudinal axis 302 than base 404. Further, each internal flow feature 316 has a varying cross-section along longitudinal axis 302. As is evident, a first cross-section of each internal flow feature 316 taken in a first plane 412 is different than a second cross-section of the same internal flow feature 316 taken in second plane 414. Notably, three-dimensional flow features, such as internal flow features 316, cannot be formed using at least some known flow feature fabrication techniques.

Figure 11:
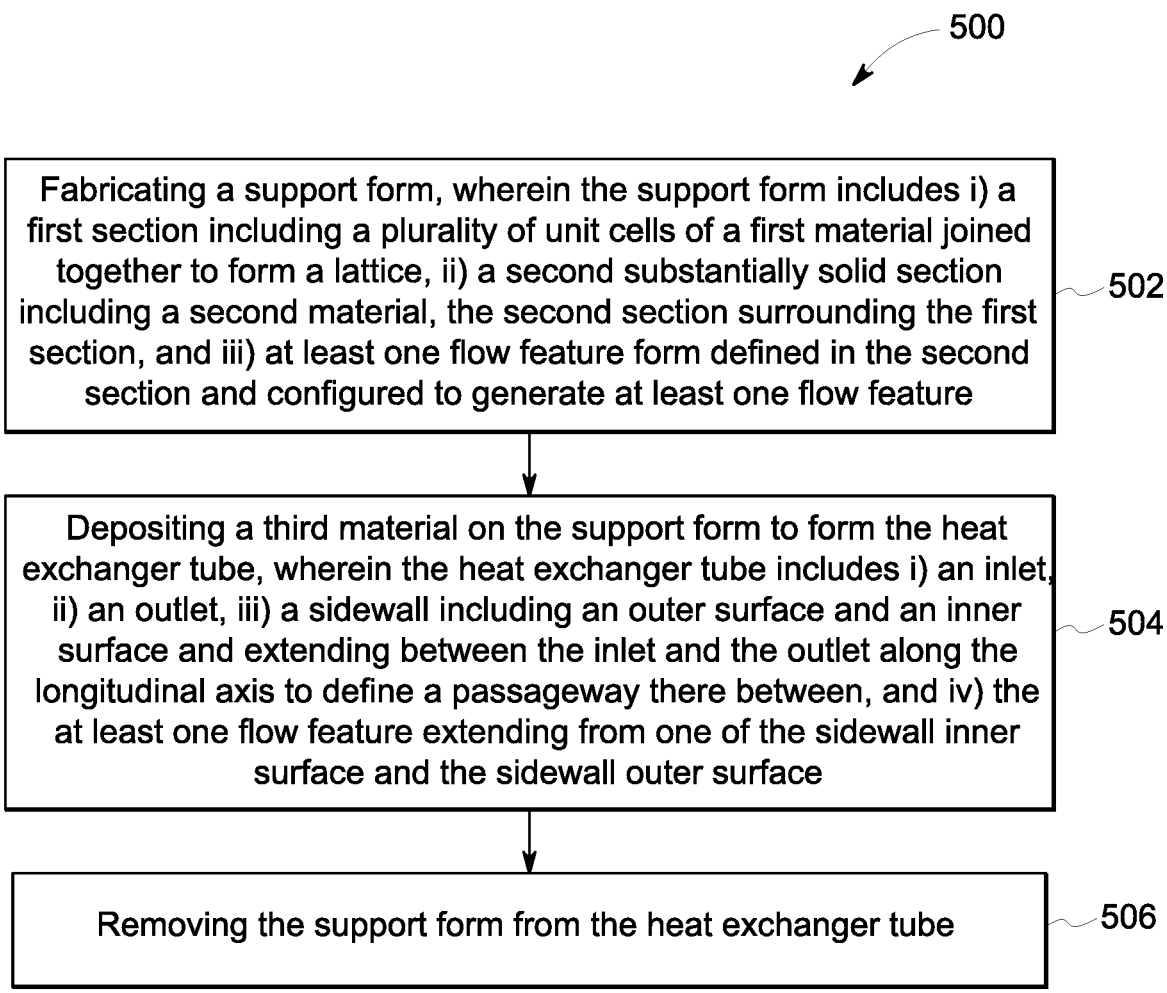
FIG. 11 is a flowchart of an exemplary method that may be used to fabricate the heat exchanger tube segment shown in FIG. 8.

FIG. 11 is a flow chart illustrating a method 500 for fabricating heat exchanger tube segment 300, wherein heat exchanger tube segment 300 defines a longitudinal axis 302. Referring to FIGS. 1-10, method 500 includes fabricating 502 a support form 200, wherein support form 200 includes i) a first section 202 including a first material 204 and a plurality of unit cells 206 joined together to form a lattice, ii) a second, substantially solid section 208 including a second material 210, second section 208 surrounding first section 202, and iii) at least one internal flow feature form 212 extending inward from an outer wall 216 of second section 208. In the exemplary embodiment, support form 200 is fabricated using an additive manufacturing process. Alternatively, support form 200 may be formed using any process that facilitates operation of support form 200 as described herein.

In the exemplary embodiment, method 500 also includes depositing 504 a third material 310 on support form 200 to form heat exchanger tube segment 300, wherein heat exchanger tube segment 300 includes i) an inlet 304, ii) an outlet 306, iii) a sidewall 308 including an outer surface 312 and an inner surface 314 and extending between inlet 304 and outlet 306 along a longitudinal axis 302 to define a primary passageway 330 therebetween, and iv) at least one internal flow feature 316 extending inward from the sidewall inner surface 314. In the exemplary embodiment, heat exchanger tube segment 300 is formed by electroplating support form 200 with a copper material. In alternative embodiments, heat exchanger tube segment 300 may be formed using any type of material deposition process using any type of material that facilitates operation of heat exchanger tube segment 300 as described herein.

Finally, method 500 further includes removing 506 support form 200 from heat exchanger tube segment 300. In the exemplary embodiment, removing 506 support form 200 from heat exchanger tube segment 300 includes exposing support form 200 to an elevated temperature sufficient to effect a phase change in the physical state of support form 200, causing support form 200 to flow out from within heat exchanger tube segment 300. In alternative embodiments, support form 200 may be removed from heat exchanger tube segment 300 through the use of oxidation, burning, shattering, leaching, dissolving, or sublimation. In other alternative embodiments, support form 200 may be removed from heat exchanger tube segment 300 by any method that enables operation of heat exchanger tube segment 300 as described herein. Because plating 504 deposits a material on support form 200, wherein support form 200 represents an inverse model of heat exchanger tube segment 300, method 500 enables forming complex three-dimensional internal flow features that are difficult to form using at least some known techniques.

The embodiments described herein include a support form having a multi-structure cross-section and at least one internal flow feature form, and a heat exchanger tube having at least one internal flow feature extending from an inner sidewall. The multi-structure cross-section of the support form includes a first section including a plurality of unit cells joined together to form a lattice and a second substantially solid section surrounding the first section. The geometry of the flow feature facilitates improving heat transfer capabilities and/or hydraulic capabilities of the heat exchanger tube relative to two-dimensional flow features fabricated using existing methods.

An exemplary technical effect of the methods, systems, and apparatus described herein includes at least one of: (a) enabling fabrication of three-dimensional flow features inside a heat exchanger tube; (b) improving heat transfer capabilities of a heat exchanger tube; and (c) improving hydraulic capabilities of a heat exchanger tube.

Exemplary embodiments of electronic systems that include heat transfer assemblies are described above in detail. The electronic systems, and methods of operating and manufacturing such systems and devices are not limited to the specific embodiments described herein, but rather, components of systems and/or steps of the methods may be utilized independently and separately from other components and/or steps described herein. For example, the methods may also be used in combination with other electronic system, and are not limited to practice with only the electronic systems, and methods as described herein. Rather, the exemplary embodiment can be implemented and utilized in connection with many other electronic systems.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A support form defining a longitudinal axis, said support form comprising:
   a first section comprising a plurality of unit cells of a first material joined together to form a lattice;
   a second solid section comprising a second material, said second section surrounding said first section; and
   at least one flow feature form defined in said second section, said at least one flow feature form comprising a negative mold, wherein said support form is configured to form a heat exchanger tube by plating said support form, and wherein said at least one flow feature form is configured to yield a positive cast of a flow feature on the heat exchanger tube formed by plating said support form.

2. The support form in accordance with claim 1, wherein said at least one flow feature form comprises a three-dimensional flow feature form having a varying cross-section along the longitudinal axis of said support form.

3. The support form in accordance with claim 1, wherein said first section is coupled to said second section.

4. The support form in accordance with claim 1, wherein said first material and said second material are the same.

5. The support form in accordance with claim 1, wherein said at least one flow feature form comprises a transverse flow feature form that extends from a first portion of second section to a second portion of said second section.

6. The support form in accordance with claim 5, wherein said transverse flow feature form is at least one of a through-passageway form and a flow straightener form.

7. The support form in accordance with claim 1, wherein said support form has a cross-sectional shape that is of one triangular, rectangular, circular, and elliptical.

8. The support form in accordance with claim 1 further comprising a first end comprising a first connector configured to engage a corresponding connector of a second support form to couple said second support form to said support form to form a continuous multiple-form support form.

9. The support form in accordance with claim 1, wherein said at least one flow feature form comprises a heat exchanger fin form that extends outward from said second section, said heat exchanger fin form comprising a negative mold configured to yield a positive cast of a heat exchanger fin.

10. The support form in accordance with claim 1, wherein said at least one flow feature form comprises a mounting feature form that extends outward from said second section, said mounting feature form comprising a negative mold configured to yield a positive cast of a mounting feature.

11. The support form of claim 1, wherein the at least one flow feature form further comprises:
   a base;
   an apex; and
   at least one wall extending from the base toward the apex.

12. The support form of claim 8, further comprising:
   a plurality of barbs extending from the first connector; and
   a retention extension disposed on the second connector,
   wherein the plurality of barbs are configured to be received against the retention extension.

13. The support form of claim 1, wherein the support form is configured to be removed from the heat exchanger tube without deformation of the heat exchanger tube.

14. The support form of claim 2, wherein the varying cross-section varies with respect to a width and a height along the longitudinal axis of said support form.

* * * * *